United States Patent [19]

Hatada

[11] Patent Number: 4,749,120

[45] Date of Patent: Jun. 7, 1988

[54] METHOD OF CONNECTING A SEMICONDUCTOR DEVICE TO A WIRING BOARD

[75] Inventor: Kenzo Hatada, Katano, Japan

[73] Assignee: Matsushita Electric Industrial Co., Ltd., Osaka, Japan

[21] Appl. No.: 943,197

[22] Filed: Dec. 18, 1986

[51] Int. Cl.⁴ .............................................. B23K 31/00
[52] U.S. Cl. ................................ 228/123; 228/180.2; 156/295
[58] Field of Search ..................... 278/175, 180.2, 214, 278/123; 29/832, 834, 840; 156/292, 295

[56] References Cited

U.S. PATENT DOCUMENTS

| | | | |
|---|---|---|---|
| 3,486,223 | 12/1969 | Butera | 228/219 |
| 4,208,005 | 6/1980 | Nate et al. | 228/175 |
| 4,314,870 | 2/1982 | Ishida et al. | 228/175 |
| 4,345,371 | 8/1982 | Ohsawa et al. | 228/175 |
| 4,582,975 | 4/1986 | Daughton | 228/180.2 |

FOREIGN PATENT DOCUMENTS

| | | | |
|---|---|---|---|
| 0098896 | 11/1978 | Japan | 228/175 |
| 0070655 | 6/1981 | Japan | 29/832 |
| 8606573 | 11/1986 | PCT Int'l Appl. | 29/832 |

Primary Examiner—Nicholas P. Godici
Assistant Examiner—Karen Skillman
Attorney, Agent, or Firm—Wenderoth, Lind & Ponack

[57] ABSTRACT

Method of connecting a semiconductor device to a wiring board in which electrical connection of metal bumps of a semiconductor device and wiring pattern of a wiring board is accomplished by pressure application between the bumps and wiring pattern, and mechanical fixing of the semiconductor device on the wiring board is accomplished by stiffened resin by use of which resin, the semiconductor device is fixed to the wiring board. By such separation of electrical connection and mechanical fixing, reliability of both function may be improved.

5 Claims, 2 Drawing Sheets

४,७४९,१२०

METHOD OF CONNECTING A SEMICONDUCTOR DEVICE TO A WIRING BOARD

BACKGROUND OF THE INVENTION

This invention relates to method of connecting a semiconductor device to a wiring board, and more particularly to method of readily connecting electrodes of a semiconductor device to wiring pattern of a wiring board.

Recently, development of a device or piece of equipment in which many semiconductor devices are used has been facilitated. Examples of such devices are a memory card, a liquid crystal display panel, an electroluminescence display panel and so on. In these devices, many ICs and LSIs have to be disposed or mounted on a substrate of predetermined size. This must be done with relatively high density and in an ever thinner fashion.

As to methods which are used for mounting IC or LSI on a substrate, there are flip chip and tape carrier systems, each of which has the following drawbacks. In these flip chip and tape (film) carrier systems used as a semiconductor mounting method, metal projections or metal bumps are provided on electrode pads of a semiconductor device.

A relevant method of which this inventor is one the joint inventors is set forth in U.S. Pat. No. 4,494,688 to Hatada et al., entitled "Method of connecting metal leads with electrodes of semiconductor devices and metal lead therefor".

In the flip chip system, metal bumps are aligned with wiring pattern on a wiring board and then, heated to be melted sufficiently so that metal bumps are fixed to the wiring pattern. In the case of such flip chip systems, the electrical connection of a semiconductor device and wiring pattern, and the fixing of a semiconductor device on a wiring board are achieved by metal bumps or solder. Therefore, if a mounting surface of a wiring board has some twisted or curved portion and a semiconductor device is mounted and fixed on such twisted or curved surface portion through a metal bump connection, it may occur that the a semiconductor device itself or a metal bump connection is destroyed by unnecessary force owing to the twisted or curved surface portion.

On the other hand, in the case of tape carrier system, metal bumps of a semiconductor device are connected to the wiring pattern of a wiring board through flexible leads or film leads so that the above-stated unnecessary force owing to the twisted or curved surface portion may be absorbed by the flexibility of the film leads. However, this system requires film leads which increase mounting cost. Also, the area necessary for mounting increases because film leads project from the mounting surface of a semiconductor device.

As stated above, in conventional flip chip and tape carrier systems having a semiconductor device mounted by the above method, there may occur several disadvantages such as the semiconductor device itself or a connection portion of the wiring pattern and semiconductor device being destroyed owing to unnecessary induced forces. Also, the mounting cost and area size become undesirably large.

SUMMARY OF THE INVENTION

It is, therefore, a primary object of this invention to provide a method of connecting a semiconductor device to a wiring board that is capable of eliminating the above-stated disadvantages of conventional methods.

More particularly, in the method of this invention, the formation of the electrical connection and the mechanical fixing of a semiconductor device and wiring board are carried out separately without employing complicated processes.

These and other objects of this invention are accomplished by a method of connecting a semiconductor device to a wiring board which comprises providing a wiring board with a wiring pattern and providing a semiconductor device with metal bumps, disposing insulating resin which is stiffened by application of at least one of light and heat between the metal bumps and wiring pattern, positioning the metal bumps and wiring pattern in such manner that the metal bumps correspond to the wiring pattern, applying pressure in such manner that the metal bumps and wiring pattern are pressed against one another through the resin, applying at least one of light and heat to the resin to thereby stiffen the resin, and removing said pressure application and application of at least one of light and heat after the resin is stiffened.

In a specific embodiment, the resin may surround the peripheral portion of the semiconductor device. Low melting point metal may be disposed only between the metal bumps and wiring pattern. The resin may be temporarily stiffened by application of light and, thereafter, completely stiffened at ambient temperature or by heating.

According to the present invention as described herein, the following benefits, among others, are obtained:

(1) As electrical connection of metal bumps of a semiconductor device and the wiring pattern of a wiring board is carried out by pressing one to the other and the mechanical fixing of a semiconductor device and a wiring board is carried out by insulating resin, undesirable force owing to twisted or curved surfaces of a wiring board are not applied directly to a semiconductor itself or to the electrical connection portion. Thus, the problem of a semiconductor device itself or electrical connection portion being destroyed is eliminated.

(2) As metal bumps of a semiconductor device are simply pressed to the wiring pattern of a wiring board for electrical connection, there is no need to take into account the material used for the wiring pattern or the, specific structure (e.g., multi-layer structure) of the wiring pattern. Therefore, even Ti, ITO, and the like that are difficult to use for wiring patterns can be used to get good electrical connection.

(3) As the mechanical fixing is carried out by solidifying resin optically or thermally, it is not necessary to apply heat directly to the wiring board and semiconductor device. Therefore, the wiring board and semiconductor device do not receive high temperature (e.g., more than 300° C.) so that thermal influence is kept relatively small.

(4) As the method of this invention does not require a solder, alloy, or the like the problem of an electrical connection becoming bad owing to extra solder, alloy, or the like is eliminated.

(5) As the mechanical fixing is carried out by insulating resin, the problem of electrodes of a semiconductor device being erroneously, electrically connected owing to the very short distance between adjacent is eliminated electrodes.

(6) As the method of this invention simply requires a pressing force for establishing electrical connection, and simply requires solidifying resin for mechanical fixing, mounting costs may be reduced.

While the novel features of the invention are set forth with particularly in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1A:
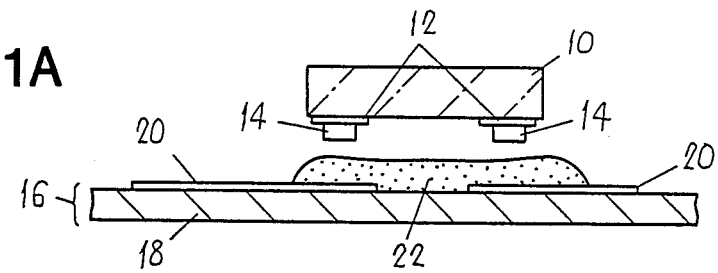
FIGS. 1A and 1B are sectional views showing the method of connecting a semiconductor device to a wiring board according to one embodiment of this invention.
Figure 1B:
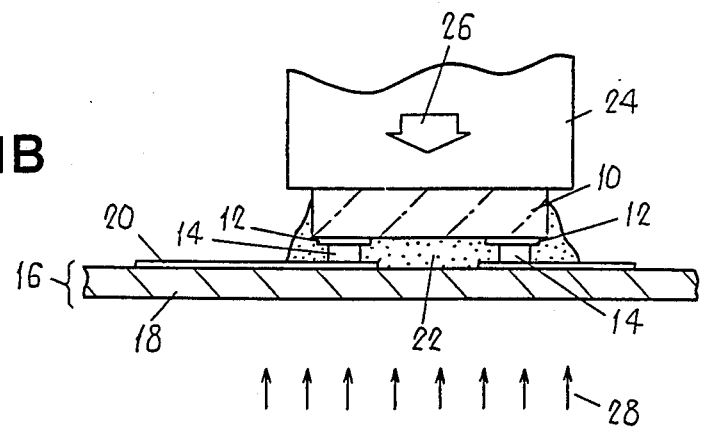

The first embodiment of this inventin is described with reference to FIG. 1. A semiconductor device (e.g., an IC chip) is designated by numeral 10. A multi-layer metal film is formed and fixed on each electrode pad 12 of semiconductor device 10. The multi-layer metal film is made by Cr-Cu, Ti-Pd, etc. Metal projection or metal bump 14 is formed on each electrode pad 12 by conventional electro-plating method. The metal bump 14 is made by Au, Ag, Cu solder, etc. and its thickness is 3–30 $\mu$m.

On the other hand, a wiring board is designated by numeral 16. The wiring board 16 includes base 18 and wiring pattern 20 which is formed on the base 18. The base 18 is made by glass, ceramic, resin or, metal whose surface is covered by metal oxide, and so on. The wiring patterns 20 are formed on a surface of base 18 and designed to receive corresponding metal bumps 14 of semiconductor device 10. The wiring patterns 20 include, as principal material, Cu, Al, Au, ITO, etc., and for example, when Cu (which is readily oxidized) is selected as principal material, Au plating, Sn plating, solder plating, etc. is applied thereto.

Further, insulating synthetic resin 22 is disposed on wiring board 16 at the position to which semiconductor device 10 is attached. The resin 22 may be disposed on a bottom surface of semiconductor device 10. The resin 22 may be liquid or sheet material, and solidified by light or heat. The resin 22 may be a modified acrylate.

The semiconductor device 10 is held by a movable tool 24 and positions of metal bumps 14 are adjusted to be in correspondence with wiring patterns 20 of wiring board 16. Then, metal bumps 14 are pressed against wiring pattern 20 by downward movement of tool 24 in the direction of arrow 26. By this pressure applied in the direction of arrow 26, resin 22, which is disposed between metal bump 14 and wiring pattern 20, is pressed to be expanded outwardly so that resin 22 is removed from the area between metal bump 14 and wiring pattern 20 and metal bumps 14 are electrically connected to wiring pattern 20.

In this position, light or heat 28 is applied to resin 22. Thereby, resin 22 is stiffened or solidified. By such stiffened resin 22, semiconductor device 10 and wiring board 16 are fixed with metal bumps 14 being electrically connected to wiring patterns 20. Thereafter, light or heat (28) application is stopped and then, pressure (26) application is removed.

As explained above, in the first embodiment, the electrical connection of metal bumps 14 of semiconductor device 10 and wiring pattern 20 of wiring board 16 is accomplished by the application of pressure, and the fixing of semiconductor device 10 and wiring board 16 is accomplished by stiffened resin.

The resin 22 is of a modified acrylate group. In the case that resin 22 is stiffened by light, the stiffening operation is completed by the application of ultraviolet light of 300–400 nm for approximately 20–60 seconds at an energy of 20 mW/cm$^2$. In the case of stiffening by use of heat, the stiffening operation is completed by application of heat whose temperature is 100°–150° C. for 5–30 minutes. In these cases, given a surface size of metal bump 14 is 70×70 $\mu$m and metal bump 14 being made of Au, electrical resistance of the connection portion becomes approximately 1–10 m$\Omega$.

If insulating resin 22 is of a combination type, e.g., light stiffening and natural stiffening, light application may be carried out both from the semiconductor device side (upperside in FIG. 1) and from the wiring board side (lower side) because, even if an unstiffened portion of resin 22 remains; it is stiffened by the lapse of time.

If insulating resin 22 is of another combination type, e.g. light stiffening and heat stiffening, a part of the resin is stiffened by light application so that semiconductor device 10 and wiring board 16 are temporarily fixed, and thereafter, they are completely fixed by heat application.

In these cases, fixing can be accomplished with a higher reliability by the use of pressure application when unstiffened resin is stiffened at normal temperature or by heating after light application is completed. In this case, there arises no problem even if the pressure to be applied is less than that upon light application.

Figure 2:
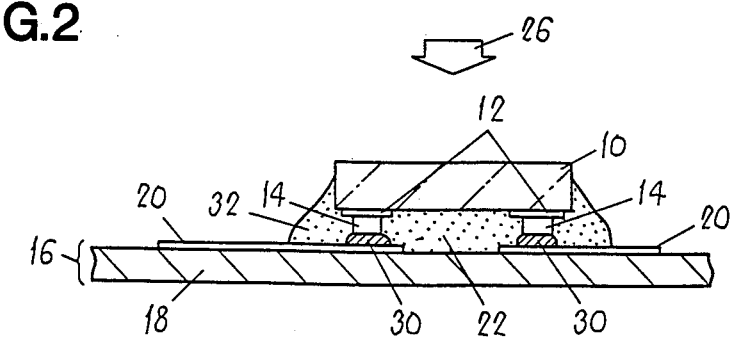
FIG. 2 is a sectional view showing another embodiment of the method of this invention.

FIG. 2 shows a second embodiment of the invention. The basic process and structure of this second embodiment is the same as those of the first embodiment. The difference between the first and second embodiments is that, in the second embodiment, low melting point metal 30 is disposed between metal bump 14 and wiring pattern 20. The low melting point metal 30 is soft material and made of, for example, alloy of the In.Ga group, In.Sn group, or Pd.Sn group. The metal 30 has a characteristic that its viscosity varies in accordance with temperature in the range of temperature wherein the semiconductor device is used. That is, even if there is a temperature increase or mechanical force is applied to semiconductor device 10 and wiring board 16, such change of temperature or force is amply absorbed by the low melting point metal 30 so that the electrical connection of metal bumps 14 and wiring board 16 is reliably maintained.

If resin 22 surrounds peripheral area 32 of semiconductor device 10 and is stiffened, resin 22 protects electrode pad 12 so that a highly reliable semiconductor device is obtained.

In the above embodiments, metal bumps 14 are formed on electrode pads 12 of semiconductor device 10. The metal bumps may be formed on wiring patterns 20 of wiring board 16.

Figure 3A:
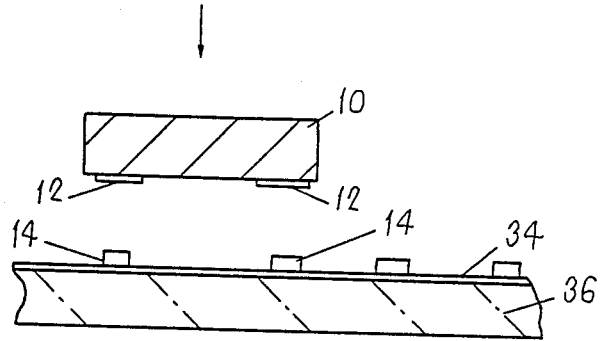
FIGS. 3A and 3B are sectional views showing still another embodiment of the method of this invention.
Figure 3B:
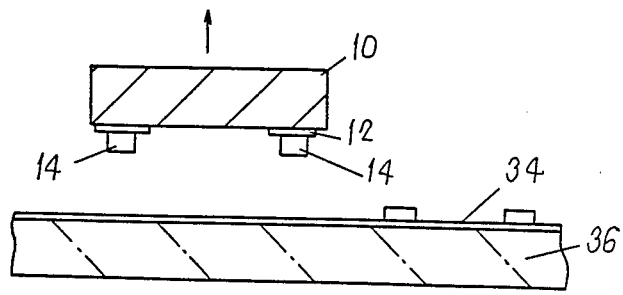

FIGS. 3A and 3B show a third embodiment of this invention. In the first and second embodiments, metal bump 14 is formed on electrode pad 12 or wiring pattern 20 through at least multi-layer metal film. In the third embodiment, metal bump 14 may be formed more easily. A conductive layer 34 is formed on a substrate 36 which is made by glass, resin, ceramic. Metal bumps 14 are formed on conductive layer 34 at such positions that they correspond to electrode pads 12 of semiconductor device 10. Then, the electrode pads 12 are positioned with and pressed against metal bumps 14 on conductive layer 34 so that metal bumps 14 are transferred to semiconductor device 10. Thereafter, FIGS. 1A and 1B or 2 processes are carried out.

As insulating resin 22, any resin such as epoxy group, acryl group, silicon group, butadien group, a modified acrylate group, or the like may be used.

In these embodiments, metal bumps are formed between electrode pads of a semiconductor device and the wiring pattern of a wiring board. Therefore, when the pressure application is carried out, it is never the case that an end portion of a semiconductor device contacts to the wiring pattern and injures the surface of the semiconductor device. The metal bumps are formed in thickness of 5–30 μm.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What I claim is:

1. A method of connecting a semiconductor device to a wiring board comprising:
   providing a wiring board with a wiring pattern and a semiconductor device with metal bumps;
   disposing hardenable insulating resin which is stiffened by application of at least one of light and heat between said metal bumps and wiring pattern;
   positioning said metal bumps and wiring pattern in such manner that the metal bumps correspond to said wiring pattern;
   applying pressure in such manner that said metal bumps and wiring pattern are pressed through said resin and against one another in conductive contact thereby electrically connecting said metal bumps to said wiring pattern leaving resin around the thus contacted wiring pattern and metal bumps;
   applying at least one of light and heat to said resin, concurrently with the step of applying pressure, to thereby stiffen the resin, whereby said metal bumps and wiring pattern pressed together in said step of applying pressure are held together by said resin; and
   removing the pressure application and application of at least one of light and heat after said resin is stiffened.

2. The method of claim 1, wherein said resin surrounds the peripheral portion of said semiconductor device.

3. The method of claim 1, further comprising the step of disposing low melting point metal only between said metal bumps and wiring pattern.

4. The method of claim 1, wherein said resin is partially stiffened by application of light and thereafter, completely stiffened at normal temperature or by heating.

5. A method of connecting a semiconductor device to a wiring board comprising:
   providing a wiring board with a wiring pattern and a semiconductor device with metal bumps;
   disposing hardenable insulating resin which is stiffened by application of at least one of light and heat between said metal bumps and wiring pattern;
   positioning said metal bumps and wiring pattern in such manner that metal bumps correspond to said wiring pattern;
   applying pressure in such manner that said metal bumps and wiring pattern are pressed through said resin and against one another in conductive contact thereby electrically connecting said metal bumps to said wiring pattern, and thereby expanding said resin outwardly wherein said resin surrounds the peripheral portion of said semiconductor device;
   applying at least one of light and heat to said resin to thereby stiffen the resin whereby said metal bumps and wiring pattern pressed together in the step of applying pressure are fixedly held together by said resin; and
   removing the pressure application and application of at least one of light and heat after said resin is stiffened.

* * * * *